(12) United States Patent
Risbo et al.

(10) Patent No.: US 7,034,609 B2
(45) Date of Patent: Apr. 25, 2006

(54) SWITCHING CIRCUITS

(75) Inventors: Lars Risbo, Copenhagen (DK); Anker Josefsen, Lynge (DK)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/712,746

(22) Filed: Nov. 12, 2003

(65) Prior Publication Data

US 2005/0099226 A1    May 12, 2005

(51) Int. Cl.
*H03F 3/38* (2006.01)

(52) U.S. Cl. ............... 330/10; 330/270 A; 330/251

(58) Field of Classification Search ........... 330/10, 330/207 A, 251
See application file for complete search history.

(56) References Cited

U.S. PATENT DOCUMENTS

| 4,554,512 | A | * | 11/1985 | Aiello ................ 330/10 |
| 5,077,540 | A | * | 12/1991 | Keith et al. .......... 330/10 |
| 6,127,885 | A | | 10/2000 | Colangelo |
| 6,294,954 | B1 | | 9/2001 | Melanson |
| 6,362,683 | B1 | | 3/2002 | Miao et al. |
| 6,414,614 | B1 | * | 7/2002 | Melanson ............. 330/10 |

\* cited by examiner

*Primary Examiner*—Khanh V. Nguyen
(74) *Attorney, Agent, or Firm*—W. Daniel Swayze, Jr.; W. James Brady; Frederick J. Telecky, Jr.

(57) ABSTRACT

A technique to implement removal of dead time control circuitry from the back-end of a digital switching amplifier system 100 and add dead time control circuitry on the front-end digital modulator chip. The front-end dead time control circuitry adaptively adjusts timing of the output PWM control signals 124 to optimize performance and power consumption, i.e. operate with minimum dead time for all transitions. The front-end dead time control circuitry controls all propagation delays associated with the digital switching amplifier system 100.

5 Claims, 6 Drawing Sheets

SWITCHING CIRCUITS

FIELD OF THE INVENTION

The present invention relates to switching circuits, and in particular to power circuits driving a load. Switching amplifiers, for example, may operate by controlling a set of power switches connected to a power supply line.

BACKGROUND OF THE INVENTION

In prior art arrangement of this type (FIG. 1), switches (211, 212) are connected to power supply line (255). The switching is controlled by for example a modulator circuit (11) that encodes digital audio information into a suitable modulated control signal (e.g. Pulse width modulation (PWM)). The power switches transfer energy from the power supply line to the speaker load 200 and the modulation scheme is arranged such that the encoded audio waveform is reconstructed at the load.

Such a switching output stage may be organized as an Hbridge. For example Hbridge (22) has four power switches driving the load in a Bridge Tied Load (BTL). An Hbridge can be viewed as two half bridges (21) driving each side of the load (200). A Half bridge consists of 2 power switches (211,212)—typically MOSFET devices—in a "totem pole" output stage configuration, i.e. a high side switch (211) can connect the load to the positive supply and the other low side switch (212) can connect the load to the negative (or ground) line. Normally, only one of the switches in a half bridge (21) should be on at a time (i.e. break before make).

The half bridge switch devices (211, 212) are each controlled by gate drive circuits (231, 232) that turn the switches on and off in response to a PWM signal (124) from the PWM modulator (11). A PWM modulator arrangement is described in European Patent Application 0890221. Normally, there is also other circuitry in the signal path from the PWM signal (124) to the gate drive (231,232) inputs. A switching amplifier can consist of 1, 2 or even more half bridges connected in different ways to deliver power to the load. In the following analysis, one single half bridge (21) is considered; however, the same principles can be applied to amplifier systems with any number of half bridges.

Dead-time (also called blanking time) is the term used for the time gap in connection with the break-before make operation of a half bridge such as output stage (21). In such output stages, there are two power switches (211,212) forming a series connection from power supply line PVDD (255) to ground line (256). The dead time is defined as the period of time from one of the power switches (211, 212) opening to the other closing.

Any overlap in the on-state for the switches will result in shoot through, i.e. a shorting of the power supply, which is undesirable for potentially deleterious effects upon reliability and power consumption. When shoot through happens, the dead time is defined as being negative.

In a switching class D amplifier, the performance is very much dependent on the timing related to the switching of the output stage. Ideally, the dead time should be zero for all switching transitions, giving both high performance and minimum power consumption at the same time.

When there is a positive dead time, the output waveform (257) of the half bridge (21) is not itself controlled by the bridge, since for example the high side transistor is driven off while the low side transistor is not yet on, but instead depends upon the load current. It is this contribution to the behavior of the output waveform by the external load that gives rise to distortion. For instance, if the load current is from the half bridge the ground, then the low to high transition of the output waveform (257) will be delayed until the high side switch (211) turns on, whereas if the load current direction is opposite, the low-high transition happens sooner when the low side switch (212) turns off. This causes the output waveform to be modulated in a non-linear way as function of the load current and can be seen in the example shown in FIG. 2 wherein trace 20 shows the switching control signal. In response to this signal, low side turn off occurs first after a period 21 is represented by trace 22. The high side turn on occurs later after a period 23 as represented by trace 24. In this example, dead time is represented by .t.

Both theoretical analysis and the experimental results of the present inventors have shown a strong negative impact on amplifier THD performance as the dead time increases. It seems that this relationship is substantially a square-law, apparently each doubling of the dead time results in 4 times more THD. It has been found that, the dead time must be controlled to better than 10 ns for each half bridge in order to get around 0.1% THD and even better timing control is needed for better performance than that, typically 0.05% being the target for audiophile high fidelity applications. This means that timing control of each switch must be better than 5 ns (DTA) since the dead time is the timing difference between turn on (DTA) and off (DTB) of the upper and lower switch in a Half bridge, for example.

It is known that the performance (THD) can be improved by load control or compensation such as by adding capacitive snubber circuitry to the outputs of the half bridge/ Hbridge. In such an arrangement, an example of which is described in European Patent Application 1086526, the snubber acts to reduce the rate of change in output waveform (257) and thereby reduce the non-linear effect of the dead time. However, such a snubber can add a significant charge/ discharge power loss that is proportional to the switching frequency:

$$P=U_2 * C * Fs$$

An improved snubber, described as a TT-snubber, is also described in EP 1086526 and with such a snubber (25)(FIG. 1), an output stage can sustain moderate shoot through (negative dead time) with less impact on performance and power consumption, however shoot through remains generally undesirable for the stated reasons even with such reduced susceptibility.

Clearly, an ideal implementation of a PWM amplifier would have zero deadtime; since this is not realisable, a good design will have as little deadtime as possible. Unfortunately, deadtime varies with many factors both operating and manufacturing and designing for optimum deadtime with all things considered is a daunting compromise. For this reason, numerous compensating arrangements have been applied to half bridge output stages. They fall principally into two groups: those which seek to compensate a characteristic of the bridge or the bridge devices directly (such as speed up circuits) and those which split the drive signal to the bridge halves and then seek to introduce compensating imbalance to the split drive signals.

However achieved, the goal of the added timing compensation circuitry is to make sure that the output stage operates as close to zero dead time as possible and, furthermore, to ensure that the Hbridge or half bridge responds with the same delay for low to high as for high to low transitions.

If two or more half bridge devices are to be connected in parallel operation (e.g. in order to get more power output), the requirement is furthermore that the timing of the output stages is matched within reasonable limits.

There are yet more issues which confront the designer of an integrated half bridge. For a deadtime control circuit which is a fixed or integrated design, semi-conductor manufacturing process variations set a lower limit on how well the control can work. The power processes needed to design monolithic Hbridges have typically bigger device sizes than processes for logic gate devices, leading to overall bigger switching delays for such devices. Their large size also gives a relatively big production spread in timing data and a relatively big temperature coefficient.

The big spread in timing properties gives yield problems when a certain THD performance level is required since for a reasonable yield a relatively poor performance device must be assumed in the design phase.

Furthermore, the timing of any circuitry is generally temperature dependent. This means that the performance will change over the temperature range, similarly affecting yield. Another approach is to try to control the device timing by changing the design of the circuitry. This will often involve adding more die area and thereby increase the cost. For example, one can add more complex compensating circuitry that reduces the effective temperature coefficient of the timing parameters.

In attempting to control deadtime, various arrangements which change the timing (i.e. the propagation delays) for the individual high side and low side control signals inside a half bridge have been used, e.g. circuitry that adds increments to the timing for the high side and low side controls. Since the propagation delays can only be made longer, i.e. delays which are device or process driven cannot be reduced, typically a circuit is used that can add more propagation delay at Low to high (LH) than for High to Low (LH), since this will add to the resulting dead time.

Typically, the control of the high and low sides has been separated and a circuit has been inserted in the logic path from the control input (e.g. the PWM input 124) to the high side and low side switch control signals. Such an arrangement can add dead-time by delaying the turn on more than the turn off.

The circuits/principles known to date are:

Diode plus resistor in parallel in gate drive for output mosfet switches. The turn on is slowed down by the series resistor, while the turn off is fast through the diode. This is a straight forward example of a trade off between lower distortion (performance) and added deadtime (power).

Open drain/collector logic output connected to a pull up current source/resistor with a capacitor to ground. This adds more delay at the LH transmition.

Addition of a logic network, e.g. a logical 'AND' between the control signal (which controls HL) and a delayed version of the same signal to provide a delay LH control.

Delay introduced by digital clock edges using e.g. LH control signal transmitted via D-type flip-flops to add a clocking delay.

Sensing of half bridge output node voltages to block the low side MOSFET switch from turning on until the output node voltage goes low.

Sensing of the low side power MOSFET switch gate signal in order to block the high side MOSFET from turning on until low side has turned off. These latter two cases are examples of how the power supply can be constructed to reduce distortion.

Drawbacks of the prior art approaches include the following:

They add the same additional delays for both high side and the low side path.

Dead time can never be reduced, since the solutions themselves add to the deadtime.

Some circuits are fixed and therefore raise yield issues as described above.

For other circuits, individual trimming is needed to compensate component tolerances and process variation, which implies expensive adjustment on test procedures or selection; more likely the circuit will be designed to a compromise and a yield or a performance degradation tolerated.

Designed for Power Supply purposes and not for meeting amplifier THD performance constraints. In switch Mode Power supplies, one normally seeks to have a high dead time to avoid shoot through, while THD is not a concern. Most circuits have been developed for power supplies and not for amplifiers where THD is a big concern.

As stated above, in principle, only one logic signal is needed to control a half bridge, i.e. to bring it to either a high state (high side on and low side off) or a low state (low side on and high side off).

A half bridge may be characterized by 4 timing constants measured from a single logic control input transition (e.g. the PWM signal 124 transition) to when the actual switching in the output stage takes place. The constant are determined by device parameters and may be identified as:

(1) TPD(high side turn on)
(2) TPD(high side turn off)
(3) TPD(low side turn on)
(4) TPD(low side turn off)

The dead time for the high to low (HL) transition is expressed as:

$T\text{dead}(HL)=TPD(\text{low side turn on})-TPD(\text{high side turn off})$

Similarly, the dead time at the low to high transition (LH) is:

$T\text{dead}(LH)=TPD(\text{high side turn on})-TPD(\text{low side turn off})$

One common problem is that if there is a general difference in delay between the high side and the low side paths, then this timing delta will add to the dead time at one transition and subtract in the other transition. This creates a difference in the dead-times of LH and HL of twice the delay delta. A consequence of this can be that one transition (e.g. low to high) will exhibit shoot trough while the other transition (e.g. high to low) has a long dead time. This gives the very undesirable combination of bad performance and high power consumption.

However, even if the dead time is zero at each transition (which would be the ideal case), there can still be errors due to the timing differences between the LH and HL transitions. Such timing differences will effectively change the pulse width of an incoming PWM control signal, i.e. the pulse width of an incoming control pulse will not be replicated at the power output, giving rise to duty cycle distortion, which will add to the dead time distortion of the non-ideal case.

Postulating again an ideal case means that we have the same delay for turn-on of the high side as for the low side. Together with the requirements for zero dead time, we now have 4 unknowns and 3 constraints (equations 1–3):

$TPD(\text{high side turn on}) = TPD(\text{low side turn on})$    1.

$T\text{dead}(HL) = TPD(\text{low side turn on}) - TPD(\text{high side turn off}) = 0$    2.

$T\text{dead}(LH) = TPD(\text{high side turn on}) - TPD(\text{low side turn off}) = 0$    3.

There is 1 degree of freedom for this system of equations, and one may therefore choose the total delay freely (e.g. TPD (high side turn on)).

The consequence if the TPD (high side turn on)=TPD(low side turn on) constraint is not met in practice is that the resulting pulse width would be different from the pulse width of the incoming control signal.

The effect of this pulse width error is not analyzed here in detail however it is noted that it would constitute a fixed pulse width error, so for static DC signals, there would be only a fixed DC offset error and not non-linear distortion.

For an H-bridge arrangement another issue is that the pulse width error causes a DC offset if the timing delays of the two half bridges are different, even if the two half bridges in every other respect are matched.

SUMMARY OF THE INVENTION

The present invention is able to tackle even the types of errors discussed above.

In accordance with an aspect of the present invention, dead time control is performed as part of modulation. The approach is not that of applying compensation to the switching circuit as in the prior art; indeed such circuitry may be removed from the back-end switching device and replaced by added circuitry on the digital modulator chip. A further function of the new circuitry is adaptively to adjust timing of the output PWM control signals to optimize performance and power consumption, for example to operate with minimum dead time for all transitions.

The circuit may be arranged to control any or all propagation delays. For example, the new timing control circuitry may be arranged to adjust the timing individually for a high side gate drive signal and a low side gate drive signal. For each signal, both the low-high timing as well as the highlow timing is adjusted. Thus both intrinsic dead time and delay mismatch may be compensated by this method. Nonetheless, back end circuitry, such as that identified as prior art in the foregoing, may still be employed.

The invention enables an optimized system to be configured with integrated components or even a completely integrated system provided. Since the arrangement is adaptive, no adjustable components or selective assembly is required.

The timing adjust capability may be controlled by a controller circuit that sets the proper timing delays every time the circuit arrangement is powered up or upon command at other times. The controller uses a feedback signal from the halfbridge/Hbridge, for example one that indicates when a shoot through occurs or is close to occurring. A controlling adaptive algorithm may be implemented in for example a fairly simple state machine that successively increments or decrements the timing delays added by the timing controller block e.g. micro controller algorithm as opposed to a state machine.

BRIEF DESCRIPTION OF THE DRAWINGS

In order that features and advantages of the present invention may be yet more clearly appreciated, an embodiment will now be described, by way of example only and with reference to the accompanying diagrammatic drawings, of which:

FIG. 11 shows an output transition with shoot through.

DETAILED DESCRIPTION OF THE DRAWINGS

Figure 4:
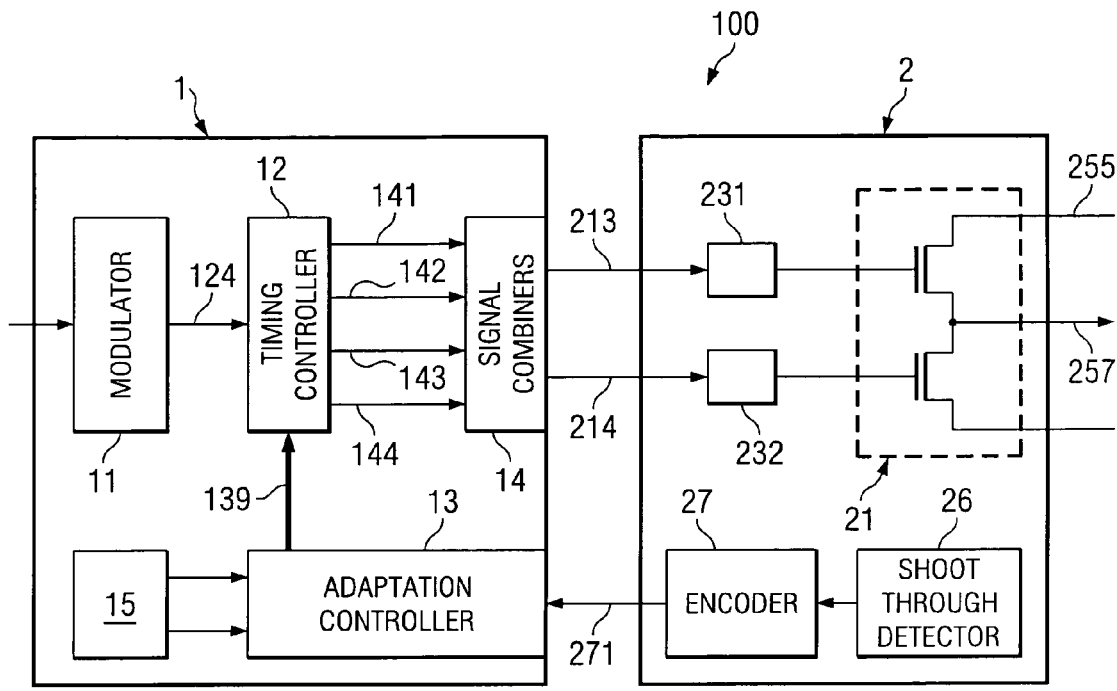
FIG. 4 shows a switching arrangement in accordance with the present invention.

In a audio amplifier arrangement in accordance with the present invention: a modulator block (11) (FIG. 4) produces a PWM signal (124) transmitted to a Timing Control circuit (12) that outputs a set of PWM pulses (141, 142, 143, 144). The block (14) combines the 4 PWM signals into a high-side (HS) and a lowside control signal (LS) (213 and 213, respectively).

The timing control circuit (12) accepts a set of digital control signals (139) from an adaptation controller circuit (13). These control signals can be for example individually programmed incremental delays on all of the 4 propagation delay signal needed to provide the control signal for the HS and LS control signals (213, 214).

The half bridge (21) can very simple without any dead-time compensation, as would be needed in the prior art, since the present arrangement is to be able to compensate for any timing differences in the back-end devices as well. To this end, the back-end devices have individual inputs for the high side and the low side. A feedback signal 271 is provided from the backend device (1) to the front-end device that indicates when shoot through takes place in the half bridge (21).

The adaptation controller (13) uses the feedback signal (271) to adjust the timing of the timing controller block (12) in order to achieve the desired timing for the half bridge (21). The feedback signal 271 is generated by an encoding circuit 27 which accepts an input from a shoot through detector circuit 26.

Elements of the arrangement will now be considered in more detail.

Timing Delay Circuit (12)

Figure 5:
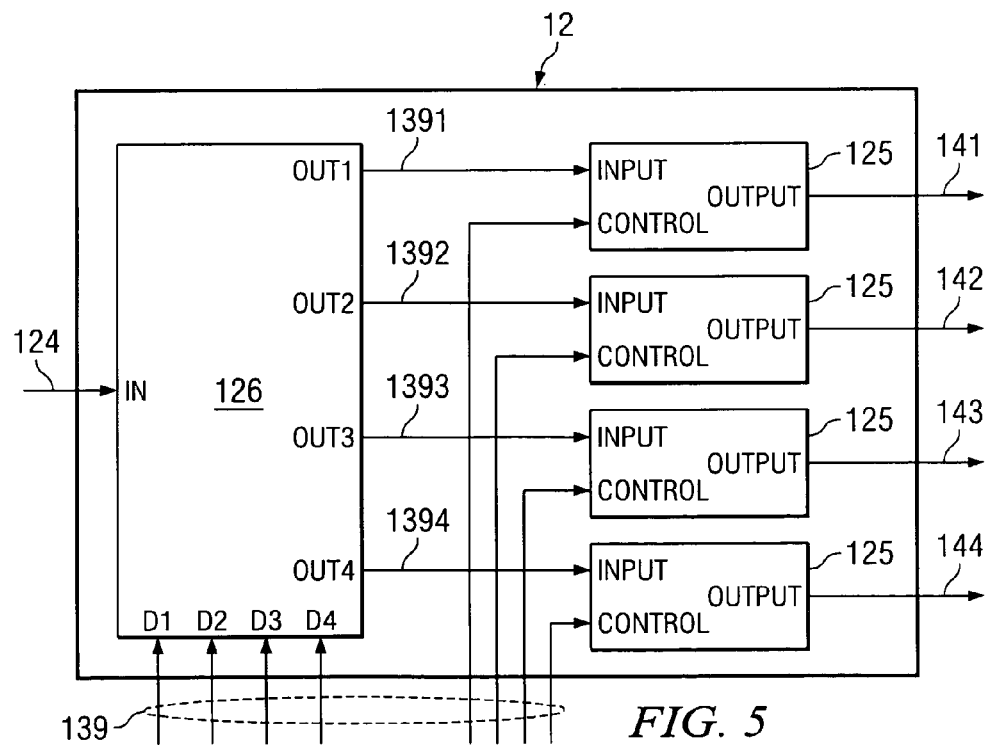
FIG. 5 Shows in detail block 12 of FIG. 4.

FIG. 5 shows one implementation of the timing circuit (12). The input PWM signal (124) is fed to a tapped delay line (126) of logic delay elements (synchronous or asynchronous)(for example of the type 128 see FIG. 6).

Four multiplexors each select one output from the tapped delay line. The selection signals are: Loff (1394), Lon (1393), Hon (1391), Hoff (1392). The multiplexor outputs are four delayed versions of the incoming PWM signal (124). The four output signals are:

HS_ON (141)
HS_OFF (142)
LS_ON (143)
LS_OFF (144)

In alternative embodiments the tapped delay line can be a combination of a synchronous delay line (running from a 100 MHz clock, for example) and a gate delay line in order to provide higher delays with fine granularity.

In general, a delay line with four individually controllable taps can be used to produce a timing control circuit with four independent controls of the LS and HS switch signals with a suitable logic network used to process the four tapped delayed signals. For example, the delay line could be composed of 16 delays of 1 ns each delay.

The multiplexors (128) may be arrays of simple pass transistor gates controlled by (L to $2^L$)-decoders, e.g. if there are 16 delays and pass transistors, then L=4, since $2^4$=16. The delay line does not necessarily have to be uniform, i.e. the timing delay of each of the elements could be different in order to give better fine versus coarse resolution capability.

The timing control block (12) may also be a combined synchronous and asynchronous circuits as shown in FIG. 5. Here the PWM signal (124) is split into 4 digitally delayed (clocked) signals that then each feed an asynchronous delay block (125). This gives a possibility of doing a coarse but highly accurate and invariant delay control using the digital delay circuit (126) combined with a fine resolution but asynchronous delay control.

Figure 6:
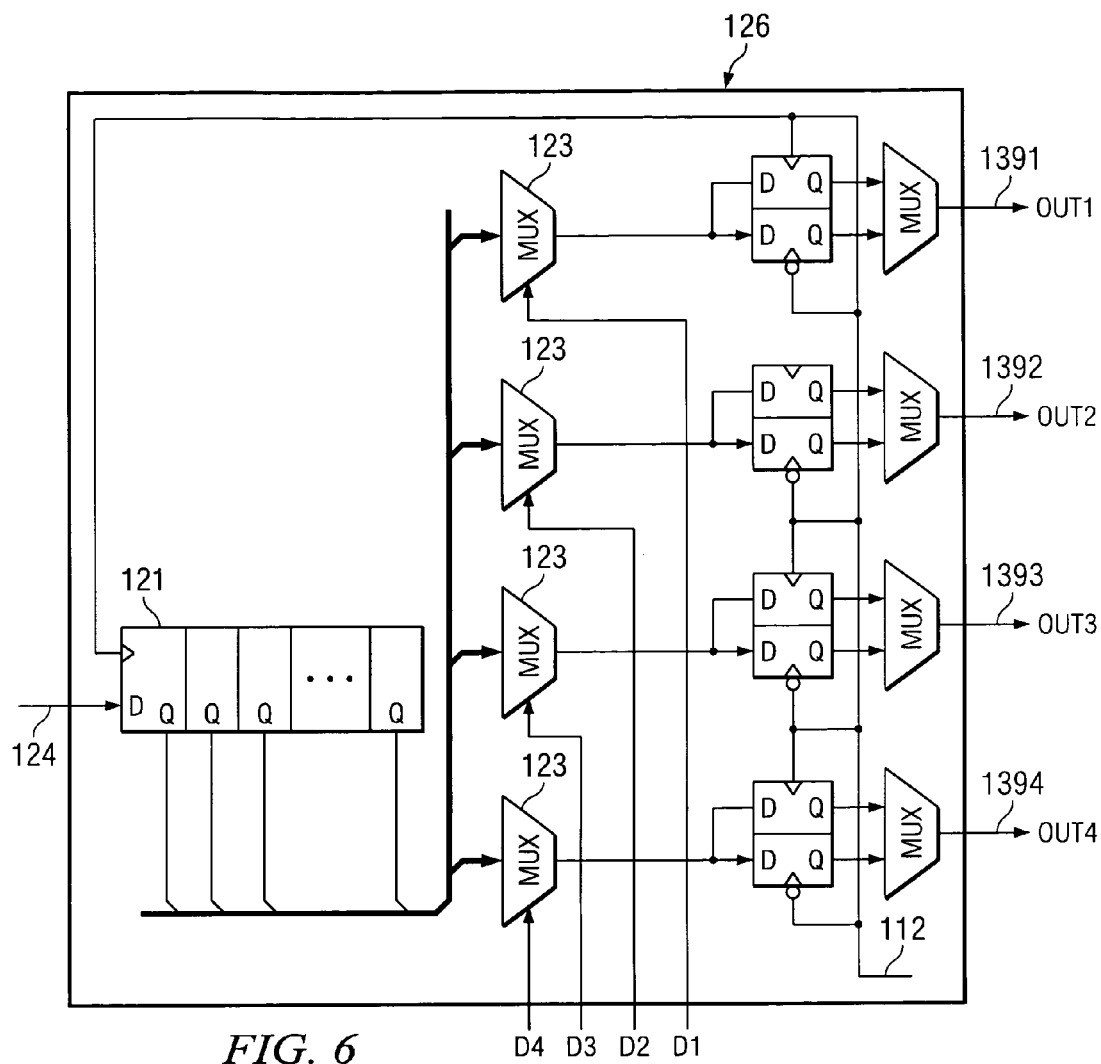
FIG. 6 Shows in detail block 126 of FIG. 5.

An embodiment of the digital delay circuit (126) is shown in FIG. 6. Here the PWM input signal (124) is fed to a digital delay line (121) with 4 taps selected by multiplexors (128). The delayed signals are then each re-clocked by two D-type flipflops. One triggering on the rising edge of the clock (112) and the other on the falling edge of the clock. A final set of multiplexors can then select delayed signal with a resolution in time of 0.5 of a clock period.

Figure 7:
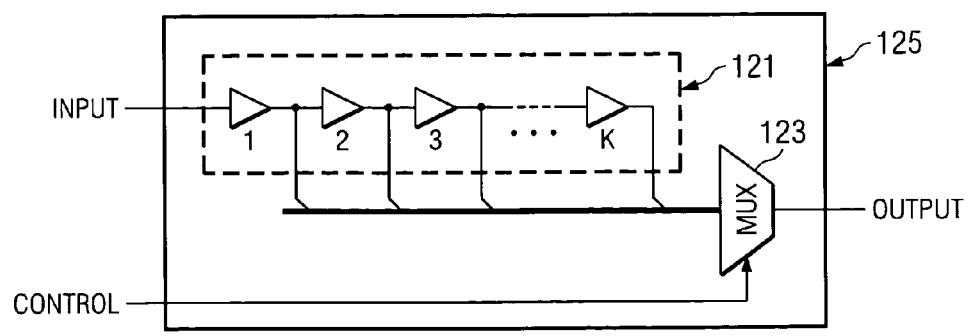
FIG. 7 Shows in detail block 125 of FIG. 5.
Figure 8:
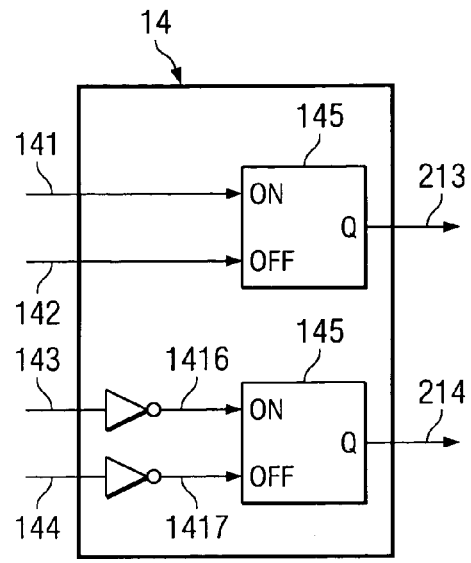
FIG. 8 Shows in detail block 14 of FIG. 5.

The optional asynchronous fine-adjust delay block (125) may be a simple tapped delay line as shown in FIG. 7. The Circuit (14) for combining the four delayed PWM signals into two bridge control signals will now be described with reference to FIG. 8.

The four delayed signals (141, 142, 143, and 144) are combined into two control signals for the half bridge (21), i.e. the HS control signal (213) and the LS control signal (214). This operation is performed in the block 14. The circuit consists of two identical 2 to 1 signal combiners (145). The control signals for the low side switch (212) must be inverted with respect to the high side. Consequently, the inputs signals controlling the low side signals are inverted first before being processed by block 141.

Figure 9:
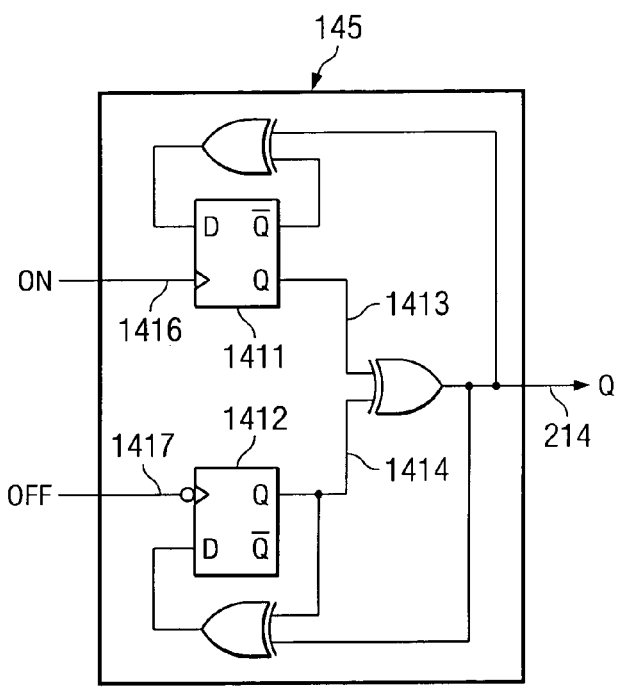
FIG. 9 Shows in detail block 145 of FIG. 8.
Figure 10:
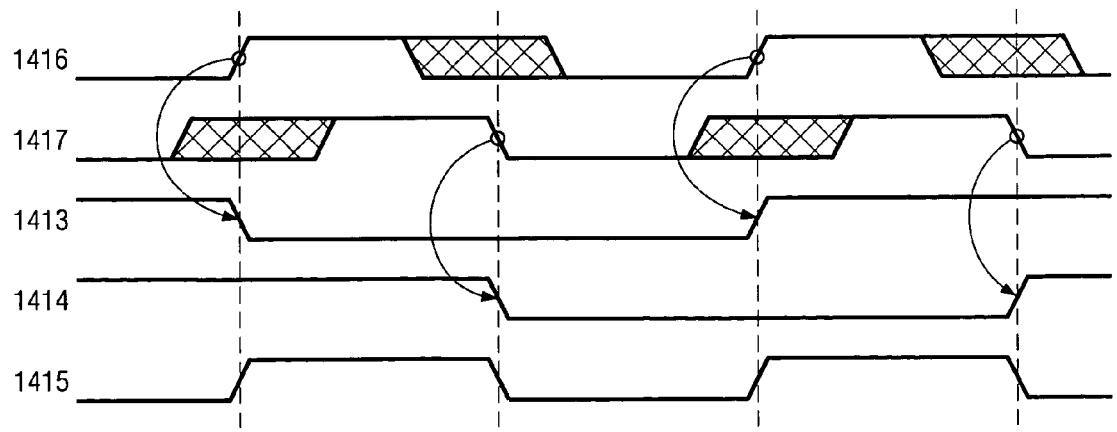
FIG. 10 shows wave form associated with FIG. 9.

An example of the two-to-one signal combiner circuit 145 for the low side device, as shown in FIG. 9 has an ON input (1416) and an OFF input (1417). The output (1415) goes high whenever the ON signal (1416) makes a LH transition. The output (1415) goes low whenever the OFF input (1417) does a HL transition. Timing of the block 141 is apparent from FIG. 10.

Shoot-Through Detection

The shoot through detection circuit (26) is arranged to detect a shoot through in a half bridge and communicate this information to the adaptation block (13) through the encoding block (27). In order to simplify the system, this communication can take place via simple logic line level signal, i.e. The detector only gives binary information: indicating either Shoot through or No Shoot through, although more levels indicating approach to and onset of shoot through are possible.

The detection must be able to discriminate between shoot through at the low-high (LH) transition and the high-low (HL) transition.

In one embodiment, the detector can be a simple threshold detector that is triggered at a certain level of shoot through. The resulting logic level signal will produce a short pulse subsequent to each transition of the half bridge (Low to high or high to low) that has a shoot through (i.e. Negative dead time).

The detection level is selected so that optimal (or desired) performance is obtained just around the detection point.

Finally, the circuitry that has to be associated with the output stage device may be very simple and robust which is to advantage considering to the higher die price of a high voltage power process technology compared to a low voltage logic process.

During shoot through, a big current spike will flow in both power switches (211, 212) of the half bridge (21). The shoot through can be detected by measuring the current in both switch devices at the same time. However, the current detector signal preferably has a fast response, since the shoot through period may be only a few nanoseconds. It can be quite difficult to measure the current on the high side switch (211), since both switch nodes are moving up and down in voltage relative to system ground. This requires complex level shifters to be used.

Figure 1:
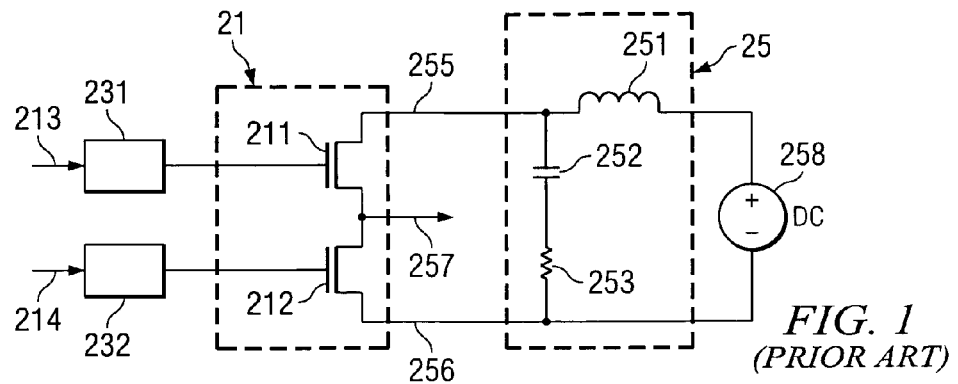
FIG. 1 represents prior art PWM switching arrangement.
Figure 2:
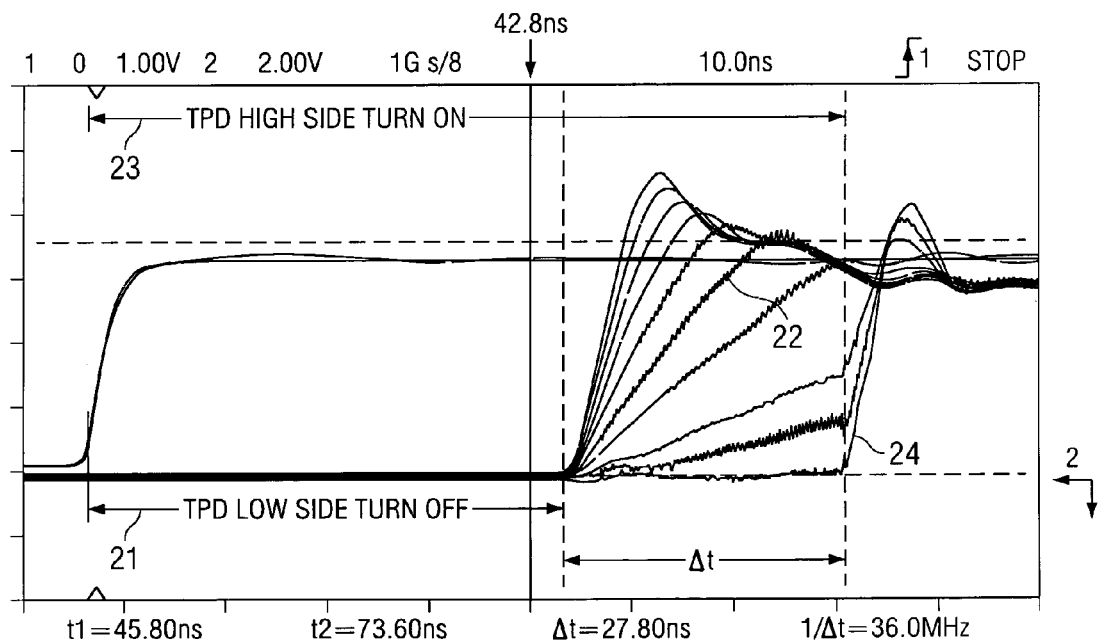
FIG. 2 shows switching performance, illustrating dead-times.
Figure 3:
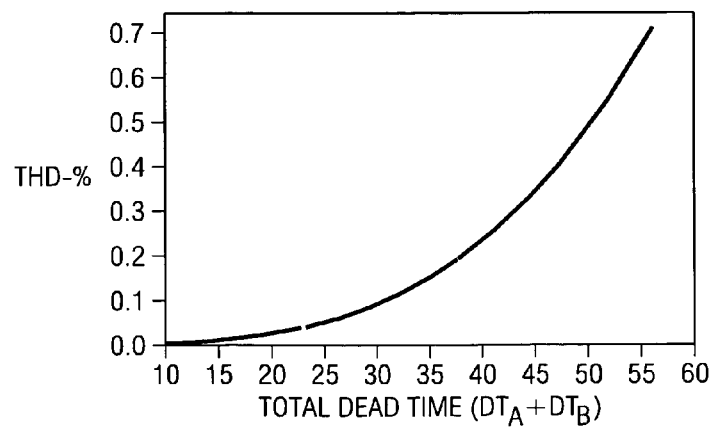
FIG. 3 shows typical Total Harmonic Distortion (THD) measured for the arrangement of FIG. 1.
Figure 11:
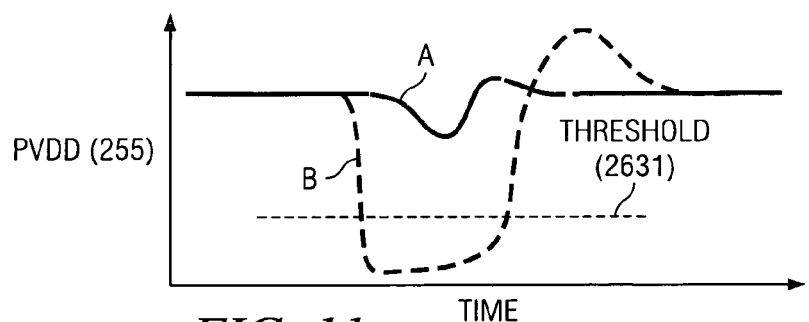

Recalling the TT-snubber arrangement mentioned earlier (25) and shown in FIG. 1, the current during shoot through will be limited by the TT snubber resistor (253). This results in the power supply pin (255) of the half bridge drooping to nearly zero volts during shoot through. This is shown in FIG. 11 where waveform B shows the voltage (255) during a transition of the half bridge (21) with shoot through. Waveform A shows a similar plot for a transition without shoot through (i.e. Positive dead time). The lowest voltage of trace B (with shoot through) depends upon the RDS(on) of the MOSFET switches (211, 212) and the snubber resistor R (253):

$$V\text{low}=2*RDS(\text{on})/(R+2*RDS(\text{on})).$$

Figure 12:
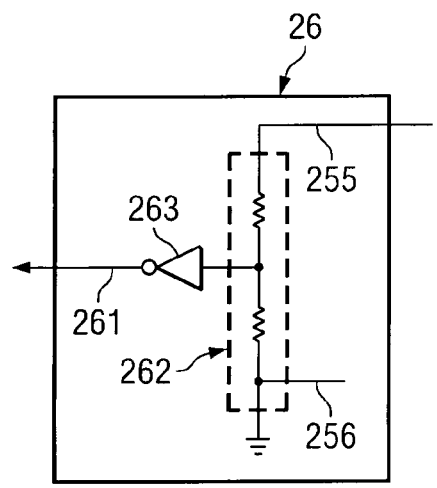
FIG. 12 shows a shot through detector.

This effect can be used for shoot through detection whereby the half bridge supply voltage (255) is compared to a threshold value (2631). The effect is used in the shoot through detector circuit (26) embodiment shown in FIG. 12. Here a voltage divider circuit (262) divides the half bridge supply voltage (255) down and feeds it to a threshold detector (263) here shown as a logic inverter gate.

The detector output signal (261) produces short logic high pulses when shoot through takes place. Advantageously, the load current of the half bridge is low. The load current should be low for proper operation of the detector.

A third approach is to use the voltage drop on the TT snubber resistor (253). However, under some circumstances, this solution may not be feasible for a completely integrated Hbridge unless this node is brought to a device pin; moreover, the voltage on the snubber resistor swings negative with respect to ground.

As thus far described, the system represents a novel embodiment of a switching arrangement in that timing control is displaced from the back end to the front end circuitry. A further advantage of the present invention is that this control may be made adaptive, and an adaptive arrangement will now be described.

Figure 13:
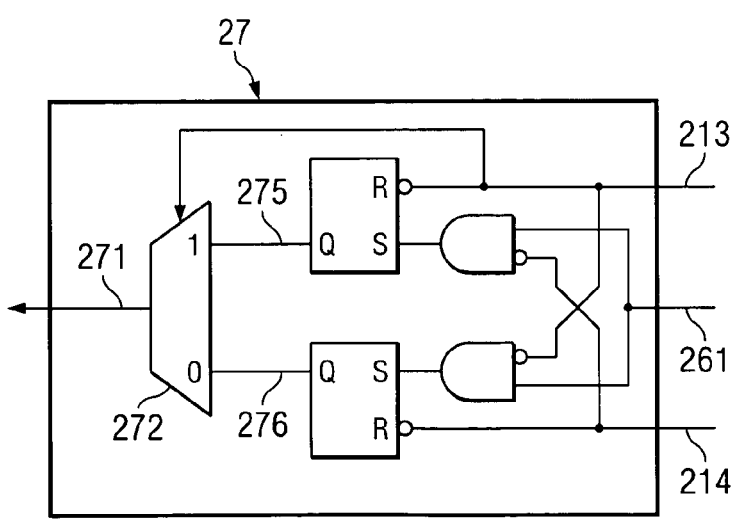
FIG. 13 shows in details block 27 of FIG. 4.

Shoot through Signal Encoding Block (27) (FIG. 13)

Figure 14:
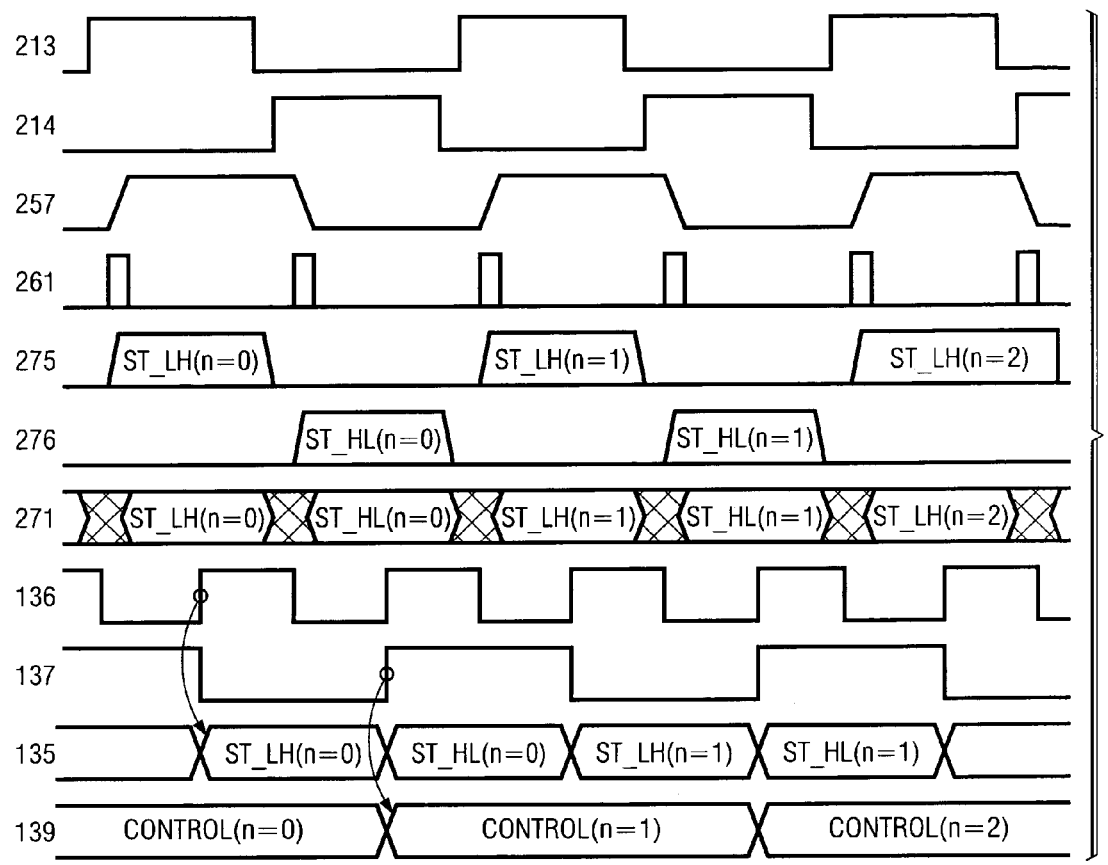
FIG. 14 shows wave forms associated with FIGS. 4 and 13.

This block encodes the short pulses of the detector signal (261) into a single logic feedback signal (271) to the adaptation unit (13). The encoder (27) multiplexes the shoot through information both the LH and the HL transition into the same logic line. The detector signal (261) may set two SR latches that are cleared by the respective switch control signals. The operation is shown in the timing diagram shown in FIG. 14. The outputs (275, 276) of the two latches contain the shoot through information for the LH and the HL transition, respectively. The feedback signal is formed by multiplexing these two latch output signals (275, 276).

Adaptation Algorithm

The general principle for the adaptation algorithm is that the dead time is reduced to the point where shoot through is just detected. If shoot through only takes place in one transition, then an asymmetrical correction is used.

The adaptation algorithm may be implemented as a state machine that looks at the result of the prior complete PWM cycle (i.e. A LH and a HL transition) and changes states of the four timing control signals. The state machine looks at all four different combinations of the 2 bit binary results from the shoot through detection in the previous cycle.

The algorithm can be described in pseudo code as follows:

```
/* START: set all 4 delays for max. dead time*/
Init:
ON_HS := ON_LS:=Tmax;
OFF_HS:=OFF_LS:=Tmin;
While Adapt_enable
{
ST_LH := read sense signal from Halfbridge for LH transition;
ST_HL := read sense signal from Halfbridge for HL transition;
If not (ST_LH) OR ST_HL then {Dec(ON_HS) ;Dec(ON_LS)};
/* No shoot through at all, decrease dead time in general */
If ST_HL AND not(ST_LH) then {Inc(ON_LS);Inc(OFF_LS)};
/* Only shoot through at HL, ie asymmetrical timing.
*/
/* Add more delay to the LS in general */
If not(ST_HL) AND ST_LH then {Inc(ON_HS);Inc(OFF_HS)};
/* Only shoot through at LH, i.e. asymmetrical timing.
*/
/* Add more delay to the HS in general */
if ST_LH AND ST_HL then {Inc(ON_HS);Inc(ON_LS)};
/* Shoot through in general . increase both dead times
*/
};
```

The above algorithm may be implemented in VLSI using VHDL design methods taking a few hundred digital gates.

In the embodiment, the adaptation time until a steady state condition is found is proportional to the number of taps in the delay line.

Example: 64 taps can be resolved in approx. 64 PWM cycles. With a PWM switching rate of 384 kHz, for example this gives an adaptation time of less than 0.2 ms.

The algorithm runs as long as the adaptation is enabled. When disabled, the four timing command register values are frozen.

Hence, the adaptation could be run as part of a production test and the constant values loaded to the individual production units, for example in one time programmable circuits or other memory. Alternatively, tests could be performed at various operating conditions and multiple values stored to be selected when the operating conditions change. More advantageously, however, the invention can provide adaptation within individual units, which can be configured and re-configured whilst in use.

The Adaptation Unit

Figure 15:
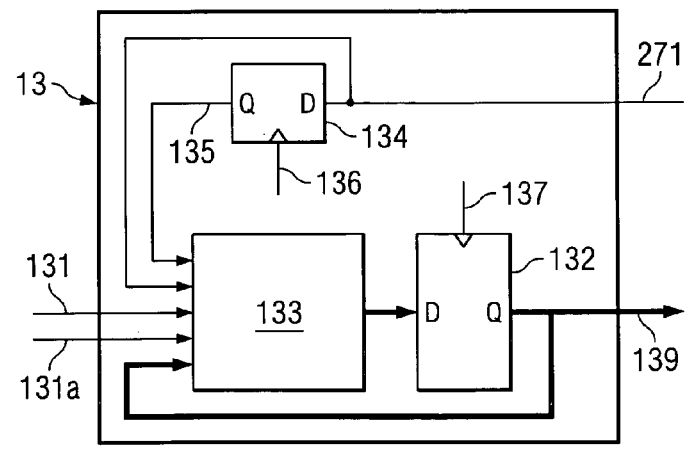
FIG. 15 shows in detail block 13 of FIG. 4.

A state-machine implementation of the adaptation unit (13) is shown in FIG. 15. The feedback signal (271) is latched by a D flip flop (143) clocked by a clock signal (136) with a rate twice the PWM rate. The feedback signal (271) as well as the flip flop output signal (136) are fed to a combinatorial function generator (133) together with the state machine output signal vector (139) and some control signals, enable ((131) and fine/coarse (131a)). The output of the combinatorial function generator (133) determines the next state machine state and is fed to an output D register (132) that is clocked by a clock (137) with a rate equal to the PWM rate. The operation of the encoder (27) as well as the adaptation unit (13) is further explained by the timing diagram shown in FIG. 14.

The adaptation works when the sense signal gives a reliable reading and when the duty cycle of the PWM signal is within reasonable limits. Advantageously, the load current is small (i.e. comparable to the ripple current).

The adaptation may for example be enabled during the system power up sequence, where a 50% duty cycle PWM signal can be sent for a while before input signal reproduction is commenced.

The system can also be commanded to execute the adaptation/calibration sequence, e.g. by a signal on a command pin of an integrated device. Signal reproduction may be stopped while the adaptation sequence is run through. Another option is to allow the system automatically to initiate calibration/adaptation when the signal being reproduced allows for it. For example when the amplitude of the signal has been low for a while it is know that the load current in the speaker is near to zero and the PWM duty cycle is close to 50%.

In some systems, the modulation stage is preceded by an interpolation filter stage that adds some processing delays. This allows for a certain amount of signal prediction in the modulator stage facilitating timely calibration.

By using the principles described above, an intelligent "auto calibrate" mode may be implemented, allowing the system to track timing changes over time and temperature whilst a music signal is being reproduced. Hence, individual units are self tuning.

One potential risk associated with on-line adaptation as described above is that the activity of the adaptation (i.e. continuous increments/decrements to the timing) could cause audible clicks in some systems.

An alternative solution could be to allow the auto calibration only in connection with the so-called "auto-mute" feature found on many commercial DACs. Here the output of a system is forced to zero (i.e. hard muted) when a long sequence of zero audio data is detected. This feature is useful for lowering the audible noise level between tracks of a CD due to the much lower noise level possible when the output is hard muted than while the DAC channel is active (i.e. the non-zero noise floor present due to the operation of the noise shaper etc.).

A similar "auto mute" feature could be implemented where the transition to the hard mute state involves a short transition sequence on a 50% duty cycle signal (which equates to silence).

The adaptation controller and circuitry may be integrated with the modulator circuitry of an integrated PWM amplifier or other switching circuitry. Since the modulator is an essential component in any PWM amplifier, the cost of implementation is marginal only. Total costs may be reduced if other compensation circuitry may be omitted.

The invention claimed is:

1. A switching amplifier controller comprising:
   a switching output stage comprising an Hbridge having 4 power switches configured to drive a load in a bridge tied configuration;
   a shoot through detector operative to detect shoot through generated by the switching output stage and generate a shoot through signal in response thereto;
   a shoot through encoder operative to generate a shoot through feedback signal in response to the shoot through signal;
   an adaptation controller operative to generate adaptive control signals in response to the shoot through feedback signal;
   a timing controller operative to generate a first set of timing control signals in response to a PWM input signal and the adaptive control signals;
   a signal combiner operative to generate a second set of timing control signals in response to the first set of timing control signals; and
   a plurality of power switch drivers operative to generate power switch turn-on signals and power switch turn-off signals in response to the second set of timing control signals to control power switch turn-on and turn-off switching transitions such that dead time associated with the switching transitions is substantially eliminated and further such that shoot through is negated during switching transitions subsequent to detection of shoot through via the shoot through detector.

2. The switching amplifier controller according to claim 1 wherein the shoot through detector configured to assist the timing controller resolve the turn-on and turn-off switching transitions such that shoot through is negated during the switching transitions.

3. The switching amplifier controller according to claim 1 wherein the timing controller is an adaptive timing controller that operates in response to a shoot through feedback signal generated by the switching output stage such that shoot through is negated during the switching transitions.

4. The switching amplifier controller according to claim 1 wherein the timing controller is further configured to prevent switching output stage shoot through during the switching transitions.

5. A switching amplifier controller comprising:
   a switching output stage; and
   means for controlling turn-on and turn-off switching transitions associated with the switching output stage in reaponse to a shoot through feedback signal caused by switching output stage shoot through, such that dead time associated with the switching transitions is substantially eliminated and further such that shoot through is negated during the switching transitions subsequent to a switching transition exhibiting shoot through,
   wherein the means for controlling turn-on and turn-off switching transitions cormpises:
   a shoot through detector operational to detect switching output stage shoot through and generate an output signal in response thereto; and
   an encoder operational to generate the shoot through feedback signal in response to the shoot through detector output signal,
   wherein the means for controlling turn-on and turn-off switching transitions further comprises:
   an adaptation controller operative to generate adaptive control signals in response to the shoot through feedback signal;
   a timing controller operative to generate a first set of timing control signals in response to a PWM input signal and the adaptive control signals;
   a signal combiner operative to generate a second set of timing control signals in response to the first set of timing control signals; and
   a plurality of switch drivers operative to generate switching output stage turn-on signals and switching output stage turn-off signals in response to the second set of timing control signals to control switch turn-on and turn-off switching transitions.

* * * * *